(12) United States Patent
Hebert

(10) Patent No.: US 9,209,173 B2
(45) Date of Patent: Dec. 8, 2015

(54) SINGLE DIE OUTPUT POWER STAGE USING TRENCH-GATE LOW-SIDE AND LDMOS HIGH-SIDE MOSFETS, STRUCTURE AND METHOD

(75) Inventor: Francois Hebert, San Mateo, CA (US)

(73) Assignee: Intersil Americas LLC, Milpitas, CA (US)

( * ) Notice: Subject to any disclaimer, the term of this patent is extended or adjusted under 35 U.S.C. 154(b) by 181 days.

(21) Appl. No.: 13/415,384

(22) Filed: Mar. 8, 2012

(65) Prior Publication Data

US 2012/0171817 A1  Jul. 5, 2012

Related U.S. Application Data

(63) Continuation of application No. 12/471,911, filed on May 26, 2009, now Pat. No. 8,168,496.

(60) Provisional application No. 61/140,610, filed on Dec. 23, 2008, provisional application No. 61/162,232, filed on Mar. 20, 2009.

(51) Int. Cl.
*H01L 27/088* (2006.01)
*H01L 21/8234* (2006.01)
*H01L 29/06* (2006.01)
(Continued)

(52) U.S. Cl.
CPC ...... *H01L 27/088* (2013.01); *H01L 21/823487* (2013.01); *H01L 29/0692* (2013.01); *H01L 29/0696* (2013.01); *H01L 29/1083* (2013.01); *H01L 29/402* (2013.01); *H01L 29/4175* (2013.01); *H01L 29/41766* (2013.01); *H01L 29/41775* (2013.01); *H01L 29/456* (2013.01); *H01L 29/66659* (2013.01); *H01L 29/66696* (2013.01); *H01L 29/66712* (2013.01); *H01L* *29/7802* (2013.01); *H01L 29/7806* (2013.01); *H01L 29/7816* (2013.01); *H01L 29/7835* (2013.01); *H01L 2224/48137* (2013.01); *H01L 2224/48247* (2013.01); *H01L 2224/49171* (2013.01); *H01L 2924/12032* (2013.01); *H01L 2924/1305* (2013.01); *H01L 2924/13055* (2013.01); *H01L 2924/13062* (2013.01); *H01L 2924/13091* (2013.01); *H01L 2924/1461* (2013.01); *H01L 2924/3025* (2013.01); *H01L 2924/30107* (2013.01); *H02M 7/003* (2013.01)

(58) Field of Classification Search
None
See application file for complete search history.

(56) References Cited

U.S. PATENT DOCUMENTS 4,924,112 A   5/1990  Anderson et al.
5,119,159 A   6/1992  Hoshi
(Continued)

OTHER PUBLICATIONS

Chinese Patent Office, "Notice on Grant of Patent Right for Invention", "from Foreign Counterpart of U.S. Appl. No. 12/477,818", Mar. 26, 2013, pp. 14, Published in: CN.
(Continued)

*Primary Examiner* — Whitney T Moore
*Assistant Examiner* — Scott R Wilson
(74) *Attorney, Agent, or Firm* — Fogg & Powers LLC

(57) ABSTRACT

A voltage converter includes an output circuit having a high-side device and a low-side device which can be formed on a single die (a "PowerDie"). The high-side device can include a lateral diffused metal oxide semiconductor (LDMOS) while the low-side device can include a trench-gate vertical diffused metal oxide semiconductor (VDMOS). The voltage converter can further include a controller circuit on a different die which can be electrically coupled to, and co-packaged with, the output circuit.

20 Claims, 8 Drawing Sheets

(51) Int. Cl.
    *H01L 29/10*     (2006.01)
    *H01L 29/40*     (2006.01)
    *H01L 29/417*    (2006.01)
    *H01L 29/45*     (2006.01)
    *H01L 29/66*     (2006.01)
    *H01L 29/78*     (2006.01)
    *H02M 7/00*     (2006.01)

(56) References Cited

U.S. PATENT DOCUMENTS

| | | | |
|---|---|---|---|
| 5,242,841 | A | 9/1993 | Smayling et al. |
| 6,130,458 | A | 10/2000 | Takagi et al. |
| 6,420,780 | B1 | 7/2002 | Ko |
| 6,700,793 | B2 | 3/2004 | Takagawa et al. |
| 6,710,439 | B2 | 3/2004 | Lee et al. |
| 6,812,782 | B2 | 11/2004 | Grant |
| 6,933,593 | B2 | 8/2005 | Fissore et al. |
| 7,042,730 | B2 | 5/2006 | Vaysse et al. |
| 7,271,470 | B1 | 9/2007 | Otremba |
| 7,459,750 | B2 | 12/2008 | Ludikhuize |
| 7,566,931 | B2 | 7/2009 | Kocon |
| 7,618,896 | B2 | 11/2009 | Joshi et al. |
| 7,732,929 | B2 | 6/2010 | Otremba et al. |
| 7,800,208 | B2 | 9/2010 | Otremba |
| 2002/0093094 | A1 | 7/2002 | Takagawa et al. |
| 2003/0098468 | A1 | 5/2003 | Wheeler et al. |
| 2004/0125573 | A1 | 7/2004 | Joshi et al. |
| 2004/0262678 | A1 | 12/2004 | Nakazawa et al. |
| 2005/0179472 | A1* | 8/2005 | Nakamura et al. ............ 327/109 |
| 2005/0245020 | A1 | 11/2005 | Zhu et al. |
| 2005/0280163 | A1 | 12/2005 | Schaffer et al. |
| 2006/0231904 | A1* | 10/2006 | Kocon ......................... 257/391 |
| 2007/0034942 | A1 | 2/2007 | Xu et al. |
| 2007/0158778 | A1 | 7/2007 | Kitabatake et al. |
| 2007/0195563 | A1 | 8/2007 | Shiraishi et al. |
| 2007/0249092 | A1 | 10/2007 | Joshi et al. |
| 2008/0017907 | A1 | 1/2008 | Otremba |
| 2008/0023785 | A1 | 1/2008 | Hebert |
| 2008/0023825 | A1 | 1/2008 | Hebert et al. |
| 2008/0024102 | A1 | 1/2008 | Hebert et al. |
| 2008/0203550 | A1 | 8/2008 | Ewe et al. |
| 2008/0246086 | A1 | 10/2008 | Korec et al. |
| 2008/0268577 | A1 | 10/2008 | Kagii et al. |
| 2009/0039394 | A1 | 2/2009 | Uno et al. |
| 2009/0057869 | A1 | 3/2009 | Hebert et al. |
| 2009/0065861 | A1* | 3/2009 | Bhalla et al. .................. 257/331 |
| 2009/0072368 | A1 | 3/2009 | Hu et al. |
| 2009/0130799 | A1 | 5/2009 | Havanur |
| 2009/0263947 | A1 | 10/2009 | Hebert |
| 2009/0283919 | A1 | 11/2009 | Tsui et al. |
| 2010/0133644 | A1 | 6/2010 | Hebert |
| 2010/0140693 | A1 | 6/2010 | Hebert |
| 2010/0155836 | A1 | 6/2010 | Hebert |
| 2010/0155837 | A1 | 6/2010 | Hebert |
| 2010/0155915 | A1 | 6/2010 | Bell et al. |
| 2011/0024884 | A1 | 2/2011 | Xue et al. |

OTHER PUBLICATIONS

U.S. Patent and Trademark Office, "Final Office Action", "U.S. Appl. No. 13/048,165", Mar. 19, 2013, pp. 1-17.
U.S. Patent and Trademark Office, "Notice of Allowance", "U.S. Appl. No. 13/048,165", Apr. 19, 2013, pp. 1-10.
European Patent Office, "European Search Report", mailed Jun. 1, 2012, Published in: EP.
Korean Intellectual Property Office, "Notice of Allowance", May 15, 2012, pp. 1-3.
Chinese Patent Office, "First Office Action", Aug. 2, 2012, pp. 1-12, Published in: CN.
European Patent Office, "Partial European Search Report", "from Foreign Counterpart of U.S. Appl. No. 12/470,229", Feb. 22, 2012, pp. 1-6, Published in: EP.
European Patent Office, "Extended European Search Report", "from Foreign Counterpart of U.S. Appl. No. 12/470,229", Jun. 1, 2012, pp. 1-12, Published in: EP.
Korean Intellectual Property Office, "Notice of Allowance", "from Foreign Counterpart of U.S. Appl. No. 12/470,229", Nov. 30, 2011, pp. 1-3.
U.S. Patent and Trademark Office, "Final Office Action", "U.S. Appl. No. 12/470,229", Mar. 3, 2011, pp. 1-15.
U.S. Patent and Trademark Office, "Notice of Allowance", "U.S. Appl. No. 121470,229", Dec. 28, 2011, pp. 1-12.
U.S. Patent and Trademark Office, "Office Action", "U.S. Appl. No. 12/470,229", May 14, 2010, pp. 1-7.
U.S. Patent and Trademark Office, "Office Action", "U.S. Appl. No. 12/470,229", Oct. 6, 2010, pp. 1-9.
U.S. Patent and Trademark Office, "Office Action", "U.S. Appl. No. 12/470,229", Sep. 7, 2011, pp. 1-12.
U.S. Patent and Trademark Office, "Restriction Requirement", "U.S. Appl. No. 12/470,229", Apr. 19, 2010, pp. 1-6.
Chinese Patent Office "Frist Office Action", "from Foreign Counterpart of U.S. Appl. No. 12/471,911", Aug. 2, 2012, pp. 1-12, Published in: CN.
Application Patent Office, "Extended European Search Report", "from Foreign Counterpart of U.S. Appl. No. 12/471,911", Jun. 1, 2012, pp. 1-14, Published in: EP.
European Patent Office, "Partial European Search Report", "from Foreign Counterpart of U.S. Appl. No. 12/471,911", Feb. 21, 2012, pp. 1-7, Published in: EP.
Korean Intellectual Property Office, "Notice of Allowance", "from Foreign Counterpart of U.S. Appl. No. 12/471,911", May 15, 2012, pp. 1-3.
Korean Patent Office, "Office Action", "from Foreign Counterpart of U.S. Appl. No. 12/471,911", Jan. 2, 2012, pp. 1-7, Published in: KR.
"Korean Patent Office, Action", "from Foreign Counterpart of U.S. Appl. No. 12/471,911", Mar. 14, 2012, pp. 1-8 Published in KR.
Korean Patent Office, "Office Action", "from Foreign Counterpart of U.S. Appl. No. 12/471,911", Apr. 18, 2012, pp. 1-7, Published in: KR.
U.S. Patent and Trademark Office, "Notice of Allowance", "U.S. Appl. No. 12/471,911", Aug. 5, 2011, pp. 1-7.
U.S. Patent and Trademark Office, "Notice of Allowance", "U.S. Appl. No. 12/471,911", Jan. 3, 2012, pp. 1-12.
U.S. Patent and Trademark Office, "Office Action", "U.S. Appl. No. 12/471,911", Apr. 15, 2011, pp. 119.
Chinese Patent Office, "Office Action", "from Foreign Counterpart of U.S. Appl. No. 12/477,818", Dec. 7, 2011, Published in: CN.
Chinese Patent Office, "Office Action", "from Foreign Counterpart of U.S. Application No. 12/477,818", Oct. 17, 2012, pp. 1-16, Published in: CN.
U.S. Patent and Trademark Office, "Notice of Allowance", "U.S. Appl. No. 12/477,818", Oct. 29, 2010, pp. 1-13.
U.S. Patent and Trademark Office, "Notice of Allowance", "U.S. Appl. No. 12/477,818", Feb. 22, 2011, pp. 1-13.
U.S. Patent and Trademark Office, "Restriction Requirement", "U.S. Appl. No. 12/477,818 ", Jul. 6, 2010, pp. 1-7.
European Patent Office, "Office Action", "from Foreign Counterpart of U.S. Appl. No. 12/470,229", Feb. 12, 2013, pp. 1-5, Published in: EP.
Chinese Patent Office, "Office Action", "from Foreign Counterpart of U.S. Appl. No. 12/471,911 ", Jan. 28, 2013, pp. 1-7, Published in: CN.
European Patent Office, "Office Action", "from Foreign Counterpart of U.S. Appl. No. 12/471,911", Feb. 12, 2013, pp. 1-5, Published in: EP.
Korean Intellectual Property Office, "Notice of Allowance", "from Foreign Counterpart of U.S. Appl. No. 12/471,911", Jan. 29, 2013, pp. 1-3.
Chinese Patent Office, "First Office Action", "from Foreign Counterpart of U.S. Appl. No. 12/470,229", Aug. 3, 2012, pp. 1-15, Published in: CN.
U.S. Patent and Trademark Office, "Office Action", "U.S. Appl. No. 13/048,165", Sep. 7, 2012, pp. 1-33.

* cited by examiner

US 9,209,173 B2

SINGLE DIE OUTPUT POWER STAGE USING TRENCH-GATE LOW-SIDE AND LDMOS HIGH-SIDE MOSFETS, STRUCTURE AND METHOD

CROSS-REFERENCE TO RELATED APPLICATION

This application is a continuation of U.S. Pat. application Ser. No. 12/471,911, filed May 26, 2009, which claims the benefit of provisional U.S. Provisional Application No. 61/140,610, filed Dec. 23, 2008, and U.S. Provisional Application No. 61/162,232, filed Mar. 20, 2009.

FIELD OF THE INVENTION

This invention relates to the field of semiconductor devices, and more particularly to power conversion and control structures and their methods of formation.

BACKGROUND OF THE INVENTION

Semiconductor devices which provide power converter functionality, for example for altering DC power using a DC to DC (DC-DC) converter, are used in various capacities. For example, input DC power from one or more batteries can be converted to provide one or more power outputs at voltages which can be higher or lower than the input DC voltage. Performing a power conversion function using integrated circuits (IC's) typically requires a control circuit, a DC high-side device electrically coupled with voltage in ($V_{IN}$), and a DC low-side device electrically coupled with ground. In a synchronous step-down device (i.e. a "synch buck" converter), for example, power conversion is performed to decrease voltage by alternately enabling the high-side device and the low-side device, with a switching and control function being performed by the controller circuit with high efficiency and low power loss through the device.

Power converter circuits which can operate at a high power density (for example, high voltage and high current) are needed, particularly devices which can efficiently convert high density power at a reasonable cost. One challenge with high power density is that the size of the output circuitry increases as the voltage and current rating of the converter increases. Different implementations of the controller circuit, the high-side device, and the low-side device have been used, each with its own advantages and disadvantages.

Monolithic devices could be formed which contain the controller circuit, the high-side device, and the low-side device on a single piece of silicon. In high density devices, the percent of silicon containing the controller circuitry is much smaller than the percent of silicon containing the high current output devices. The output power devices can require more than 50% of the die surface. However, forming the controller circuitry can require providing CMOS devices, bipolar devices, LDMOS devices, nonvolatile memory, diodes, resistors, capacitors, etc., and can involve the use of more than 20 mask steps during the fabrication process. In contrast, forming the output power devices can require eight or fewer mask steps for their fabrication. Because of mask misalignment and other processing issues, processing failures increase with increasing mask steps. Thus forming the controller circuitry and output devices on the same piece of silicon is inefficient and costly, because silicon formed with an eight mask process is subject to a 20 mask process failure rate and extra cost (equivalent to 12 extra mask layers). As such, monolithic devices are not used to integrate the power devices with the controller circuitry.

Co-packaged devices can include controller circuitry on one semiconductor die, the high-side device on a second die, and the low-side device on a third die. In one type of co-packaged device, the controller circuitry on one die is then connected to the high-side and low-side devices formed from standard vertical MOSFETs on the other two dies using bond wires or other connections. In another type of device, the controller circuitry on one die is the connected to the high-side device including bottom-source lateral diffusion metal oxide semiconductor (LDMOS) and a low-side vertical diffusion MOS (DMOS) device. In both of these devices, the three separate dies are then encapsulated or otherwise packaged together in one IC device. Forming controller, low-side, and high-side devices on separate dies overcomes the above-stated problems of monolithic devices. However, co-packaged devices can have problems with interconnection parasitics on the controller IC which can negatively influence device performance. This may result from parasitic inductance inherent in bond wires, electromagnetic interference (EMI), ringing, efficiency loss, etc. Higher-quality connections such as copper plate (or clip) bonding, or ribbon bonding, can be used to reduce parasitics, but this increases assembly costs. Further, co-packaging standard vertical MOSFETs can result in a circuit with parasitic inductance in series with the output node. Problems caused by parasitic inductances are well established in the art. While a capacitor can be connected to the output terminals such as the input ($V_{IN}$) and ground, to compensate for the negative impact of inductances connected to these nodes, capacitances cannot be connected to internal nodes such as the Output ($V_{OUT}$, also referred to as phase node or switched node).

Additionally, packages containing three separate dies have higher production costs, for example because of the large number of die attach steps (three in this example), and additional space is required for spacing between adjacent dies to allow for die attach fillets, die placement tolerance, and die rotation tolerance, which reduces the power-density which can be achieved. Examples of co-packaged devices include non-synch buck with co-packaged high-side MOSFET and external Schottky diode, non-synch buck with co-packaged high-side and low-side MOSFETs, synchronous buck with co-packaged high-side and low-side MOSFETs, boost converter with co-packaged MOSFET, and boost converter with co-packaged MOSFET and Schottky diodes.

Discrete devices can also be mounted separately to a printed circuit board. In this solution, a first packaged die containing controller circuitry is used in conjunction with a second packaged die containing a high-side MOSFET and a third package containing a low-side MOSFET. The three packages are mounted on a printed circuit board. However, this can increase packaging costs as the number of dies and separate packages which must be manufactured and handled is at least tripled, and the area used on the printed circuit board is also increased, leading to increased circuit board size.

There is a need for power converters in which device processing costs are reduced while providing a power converter device which has sufficient device electrical characteristics with low parasitic inductance and capacitance.

Co-pending U.S. Pat. application Ser. No. 12/470,229 titled "Co-Packaging Approach for Power Converters Based on Planar Devices, Structure and Method", having the same inventor and assignee as the present application and incorporated herein by reference in its entirety, describes a structure for providing voltage converter power devices (high-side and low-side output devices) on a single die. A structure includes the use of a lateral diffusion MOS (LDMOS) device as a high-side device and a planar vertical diffusion MOS (VDMOS) device as the low-side device. While providing reasonable cost and manufacturability which is sufficient for many uses, a low-side planar VDMOS device may not achieve a minimum specific resistance (RDS*Area) in other uses, for example because the transistor channel is planar, the cell pitch is relatively large, and there is a parasitic junction field effect transistor (JFET) resistance between adjacent body diffusions.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

Figure 1:
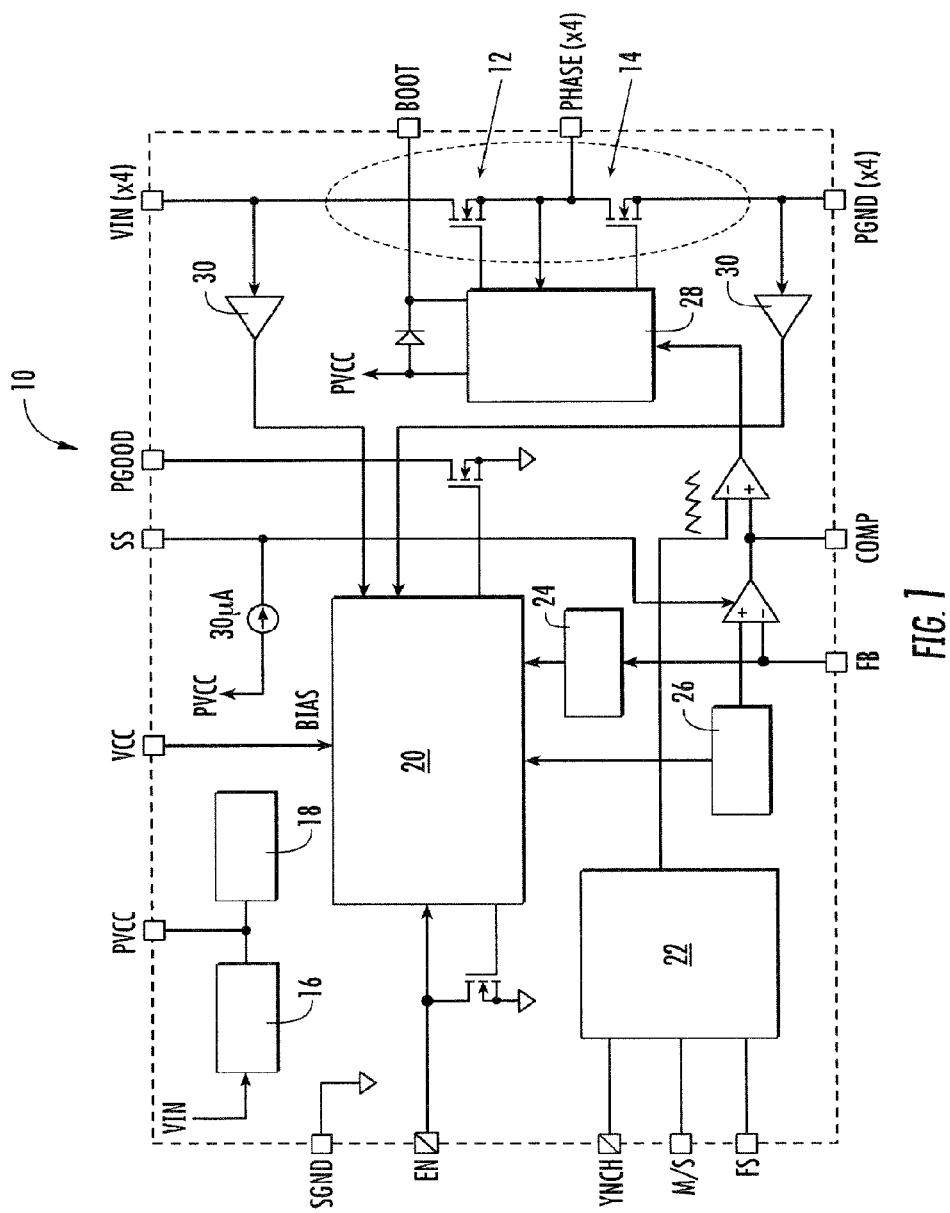
FIG. 1 is an electrical schematic including a voltage converter device.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, an examples of which are illustrated in the accompanying drawings. Wherever possible, the same reference numbers will be used throughout the drawings to refer to the same or like parts.

There is a need for power converters which are suited for very high current applications which have an $RDS_{ON}$ in the milliohm range, and which can be optimized based on the circuit requirements. In particular, a device which allows formation of high-side and low-side power converter output devices on a single die of minimum size to reduce costs, which includes a low resistance low-side device, and which provides a power converter device which has sufficient device electrical characteristics for high-frequency of operation at high power densities (high voltage and high current) with low parasitic inductance and capacitance would be desirable.

In an embodiment of the device, the high-side and low-side devices can be combined monolithically on one substrate (a first die, a "PowerDie"), with one substrate (a second die) for the control circuitry. The high-side device can be formed using a high performance lateral N-channel diffusion metal oxide semiconductor (LDMOS) field effect transistor (FET), and the low-side device can be formed from an N-channel vertical diffusion metal oxide semiconductor (DMOS) FET having a trench-gate. A low-side vertical diffusion MOSFET using a trench-gate can achieve an on-resistance ($R_{SP}$) which is one-half or less of a planar-gate VDMOS device with the same breakdown voltage. This, at least in part, can result from a smaller cell pitch and because there is no parasitic JFET in the trench-gate VDMOS.

One difficulty in combining a low-side trench-gate VDMOS and a high-side planar-gate LDMOS is that a complex process with many mask steps can result. A planar-gate LDMOS device uses a surface (hence planar) channel, diffused from the source side of the gate, laterally under the planar gate. If a trench-gate VDMOS is used as the low-side device, the channel of this device is along the sidewalls of a gate trench, formed by a body diffusion from the top surface into the silicon. Using standard processing techniques, if possible, would result in at least separate body masking, a body implant, and a body diffusion to form each device.

An embodiment of the invention thus includes a first die having output power devices and a second die having a controller circuit. The first die can include a novel high-side planar-gate LDMOS device with a low-side trench-gate DMOS, with or without an integrated Schottky diode across the body to drain junction, formed using a low number of processing stages. Trench-gate VDMOS structures are proposed for high-current applications in the low-side device because of their lower $R_{DS}$*Area figure of merit, which can result from the absence of JFET parasitic resistance, at least partially resulting from a vertical channel and a smaller cell pitch.

FIG. 1 depicts a circuit block diagram of a circuit 10 including a power converter. Depicted are output devices including a high-side device 12 and a low side device 14. This device schematic depicts a pair of N-channel MOSFET enhancement mode devices for use as the output devices. In an embodiment of the inventive device, an LDMOS MOSFET is used as the high-side device and a planar vertical DMOS MOSFET as the low-side device in a voltage converter circuit.

In addition to the signals and connections depicted, the voltage converter of FIG. 1 can include the following: series regulator 16; POR monitor 18; fault monitoring 20; clock and oscillator generator 22; voltage monitor 24; 0.6V reference 26; gate drive and adaptive shoot thru protection 28; OC monitors 30.

In the description of the embodiments below, it will be understood by those of ordinary skill in the art that the description is exemplary. Variations to the processes and resulting structures of the various embodiments, for example to the materials, thicknesses and widths, doping concentrations, etc., will be apparent. Also, some additional processing stages and material/doping layers can be included in the described processes, while other described structures and process stages may be optional and not required to form a functional device. Further, the drawings depict power devices with "striped" gate fingers, which are parallel. Variations of the geometries are possible, such as "closed cell" geometries which are well known by those of ordinary skill in the art of power devices. A closed cell geometry refers to structures with gate fingers which surround the source and body contact. The cells can be square, rectangular, hexagonal, etc.

Figure 2:
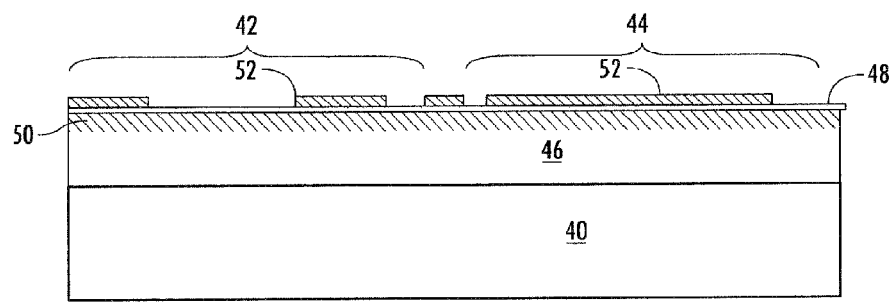
FIGS. 2-19 are cross sections depicting a first embodiment of a method and intervening structures of a voltage converter output structure.
Figure 3:
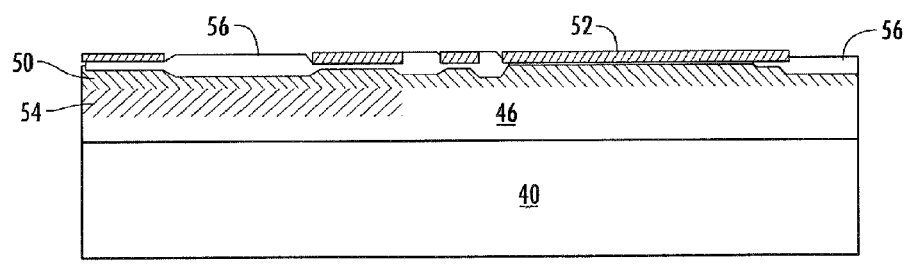

FIG. 2 depicts a substrate 40 which can include a wafer or wafer portion of a material including, for example, silicon, gallium arsenide, gallium nitride, silicon carbide. A high-side output power device will be formed at a first wafer location 42, and a low-side output power device will be formed at a second wafer location 44. The substrate 40 can be heavily doped to an N-type conductivity (N+++), for example with arsenic to a concentration of about 1E18 to 1E20 atoms/cm$^3$. In another embodiment, the substrate 40 can be a red-phosphorous doped substrate, which would reduce the overall $RDS_{ON}$ of the device. The semiconductor substrate is (or will subsequently be) configured such that the depicted region will provide its output to the power converter inductor to provide a device switched node. An N-type epitaxial (epi) layer 46 can formed according to techniques known in the art on the silicon substrate to a thickness which is a function of the desired breakdown voltage of the vertical low-side device to be formed in region 44. For a 30V breakdown voltage for example, the thickness may be in the range of about 2.5 microns to about 5 microns thick, with a doping concentration in the range of between about 2E16 atoms/cm$^3$ to about 3E16 atoms/cm$^3$. For lower-operating voltages, the epitaxial layer thickness would be reduced (as thin as 0.5 micron for example), and the epitaxial doping concentration would be increased (up to 5E16 for example). For higher operating voltages, the epi thickness would be increased and the doping concentration would be reduced. A pad dielectric (pad oxide) 47 to reduce stress, protect the substrate surface, and screen contaminants from any subsequent ion implantation step can be formed to a thickness of between about 150 angstroms (Å) to about 400 Å on the epi layer. If a red-phosphorous substrate is used, the thickness of the N-epitaxial layer can be increased to compensate for the higher up-diffusion of phosphorous from the substrate. For example, in an arsenic-doped substrate for use with a 30V device, an N-epitaxial layer can be about 3 μm nominal thickness. In an equivalent red-phosphorous doped substrate, the N-epitaxial layer can have a thickness of between about 4.5 μm to about 6 μm. Next, a blanket N-type drift implant 50 can be performed to provide, for example, a high-side LDMOS drain region, using a dose of phosphorous in the range of about 5E11 to about 4E13 atoms/cm$^2$ at an implant energy of between about 40 KeV to about 360 KeV. A oxidation masking layer 52 such as a patterned nitride layer can be formed to result in a structure similar to FIG. 2.

Next, a patterned deep body P-type (for example, boron) implant can be performed using a photoresist (resist) mask. The implant can be performed at an energy of between about 1 MeV to about 2 MeV and a dose of between about 1E13 atoms/cm$^2$ and about 1E14 atoms/cm$^2$ to provide deep body implant region 54 in the high-side device region 42. A relatively thick resist mask can be used, for example in the range of between about 4 microns to about 5 microns, to reliably block an implant performed at an energy of ≥1 MeV. The resist mask can be stripped, then a wafer clean can be performed. Next, the deep body implanted boron can be diffused to a sufficient depth by performing an anneal at a temperature of between about 1,050° C. and about 1,200° C. for between about 20 minutes to about 5 hours using an oxygen bleed during the beginning of this anneal, followed by a nitrogen ambient. Subsequently, a field oxidation can be performed to result in field oxide 56, then the nitride 52 can be stripped.

Figure 4:
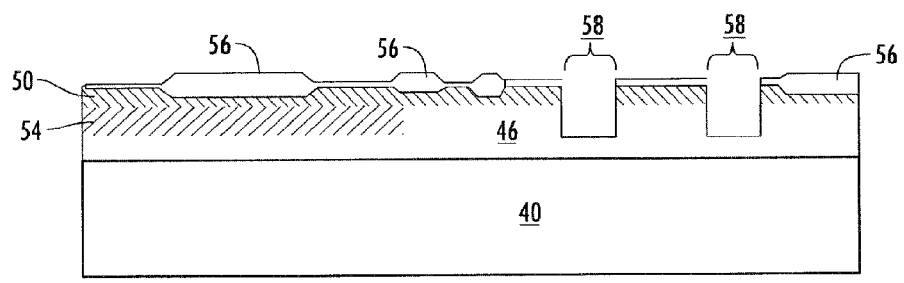

Next, a patterned trench-gate mask (not depicted) is formed to leave low-side trench-gate regions of the substrate exposed. An oxide etch to remove native or other oxide, then a silicon etch is performed to form trench-gate openings 58 in the substrate. One or more optional trench-sidewall implants can be performed which can adjust a threshold voltage ($V_T$) of the completed low-side device. Tilted implants with wafer rotation can be performed. The implants can include phosphorous to lower $V_T$ or boron to raise $V_T$. An energy of between about 20 KeV and about 80 KeV at a wafer tilt of between about 4° and about 12° would be sufficient. An optional gate-trench bottom implant can be performed using an N-type dopant to increase conductivity or a P-type dopant to reduce net concentration and $C_{GD}$ would be sufficient. The trench-gate mask is removed to form a structure similar to FIG. 4.

Figure 5:
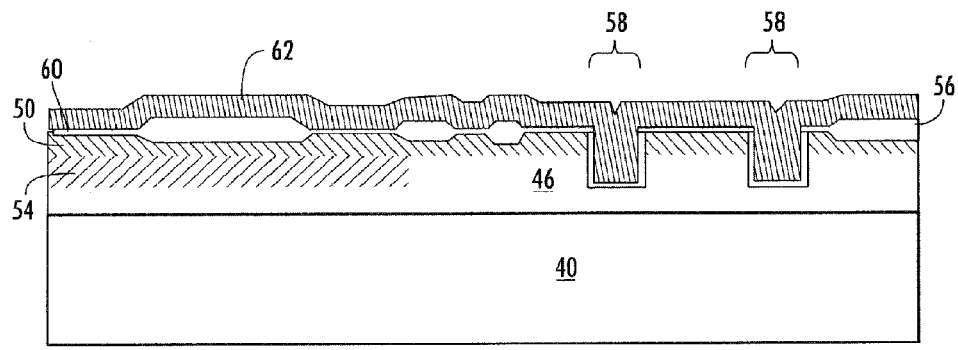

A sacrificial oxidation (sac ox) followed by a sac ox strip can be performed to remove any damaged portions of the epitaxial silicon layer 46. A gate oxidation can be performed to form gate oxide 60, then a gate polysilicon deposition and doping and/or a polycide deposition can be performed to result in blanket transistor gate layer 62 as depicted in FIG. 5. The polysilicon can be doped by ion implantation, diffusion (POCl$_3$, for example), or in situ doped during deposition. An optional silicide layer, for example WSi$_x$, can be added over the gate polysilicon layer to reduce resistance. An optional capping layer can also be formed over the transistor gate layer 62.

Figure 6:
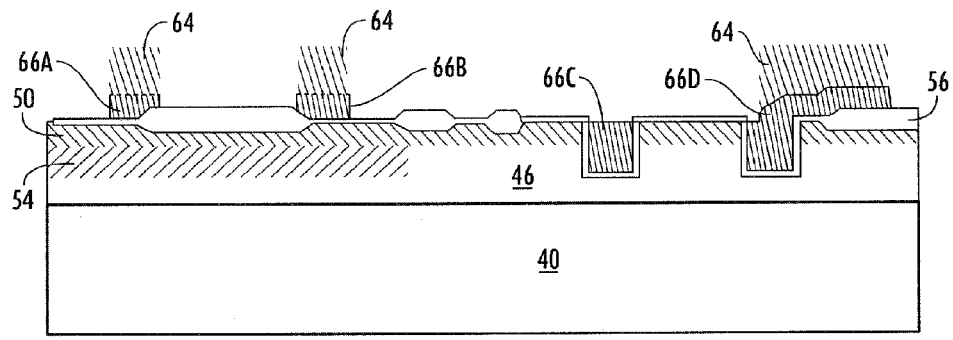

As depicted in FIG. 6, a patterned resist layer gate mask 64 can be formed over the blanket gate layer, then the gate layer is etched to result a structure similar to that depicted including transistor gate portions 66A-66D. The gate layer can be over-etched to recess the gate material within the gate trenches. The polysilicon portion 66C is self-aligned within the trench. Gate portions 66A and 66B will form a gate of the high-side LDMOS device, and gate portions 66C, 66D will form portions of a gate for one of the active cells of the low-side trench-gate MOSFET device. Gate portion 66D will form the gate to the active cell where the polysilicon is recessed below the epitaxial layer surface, as well as an electrode to enable connection of the polysilicon layer to a subsequently formed metal layer above the epitaxial layer surface and away from the gate trenches. Thus these functions are performed using different parts of a single conductive structure, which can include one or more conductive layers.

Figure 7:
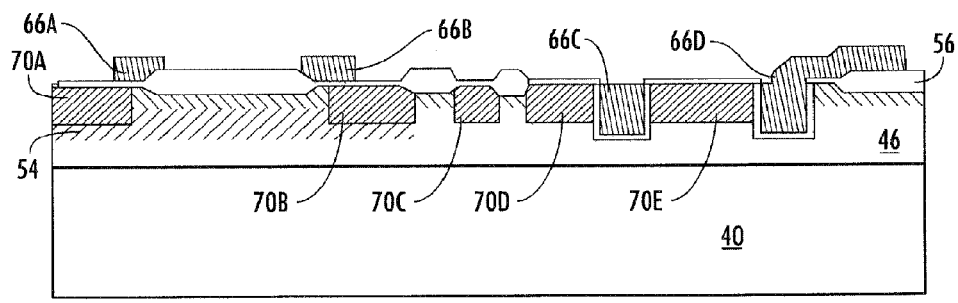
Figure 8:
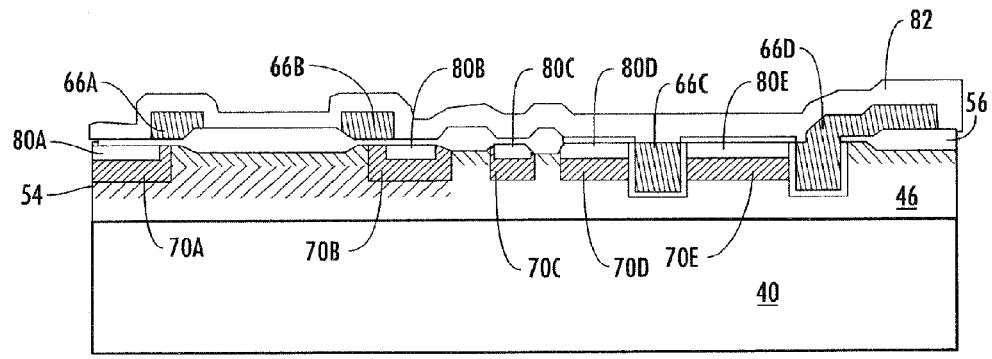

Next, the resist 64 can be removed then an unmasked (blanket) body implant of the FIG. 6 structure can be performed to result in a structure similar to FIG. 7 including body regions 70A-70E. This implant is self-aligned as no separate mask is needed, because the gate polysilicon and field oxide provide a sufficient mask. An implant of boron to a dose of between about 5E12 atoms/cm$^2$ and about 5E14 atoms/cm$^2$ at an energy of between about 20 KeV to about 80 KeV using no tilt would be sufficient. To diffuse the boron under the gates, a body (channel) drive anneal at a temperature of between about 1,000° C. and about 1,150° C. for a duration of between about 20 minutes to 3 hours in a nitrogen (N$_2$) ambient would provide a sufficient body diffusion.

Advantageously, the same body diffusion region for both the high-side region 42 and the low-side region 44 can be used because the same gate oxide and same background doping is used for both devices. This can eliminate the need for a separate mask step to form each device and decrease other associated processing requirements, thereby reducing costs over conventional processes.

A blanket source implant can then be performed, for example using arsenic at a dose of between about 4E15 atoms/cm$^2$ and about 10E15 atoms/cm$^2$. This blanket source implant is also sufficiently blocked by the gate polysilicon and the field oxide, and is therefore self-aligned to form source implant regions 80A-80E. An oxide deposition is performed to a thickness of between about 1,500 Å and about 3,500 Å, for example to about 2,500 Å. A source anneal at a temperature of between about 900° C. and about 1,000° C. in oxygen would sufficiently densify the oxide to result in blanket oxide layer 82.

Figure 9:
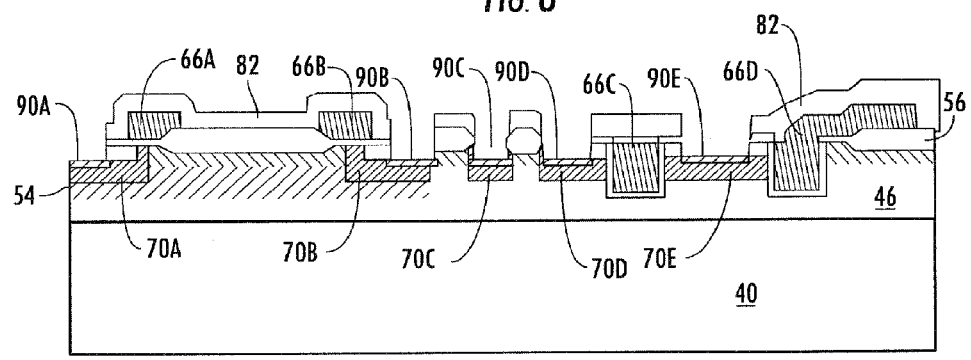

Next, a patterned body contact mask is formed. An oxide etch to remove exposed oxide and a silicon etch to remove exposed silicon epitaxial layer are performed using the patterned body contact mask. The silicon etch can etch through the source regions, for example to a depth of between about 0.2 microns to about 0.4 microns, to result in the contact openings as depicted in FIG. 9. A body contact implant, for example a shallow BF$_2$ or boron implant, with an optional deeper boron implant to a dose of between about 5E14 atoms/cm$^2$ and about 4E15 atoms/cm$^2$, can form body contact regions 90A-90E. An optional anneal, for example using rapid thermal processing (RTP) at a temperature of between about 950° C. to about 1,100° C. or a diffusion can be performed.

Figure 10:
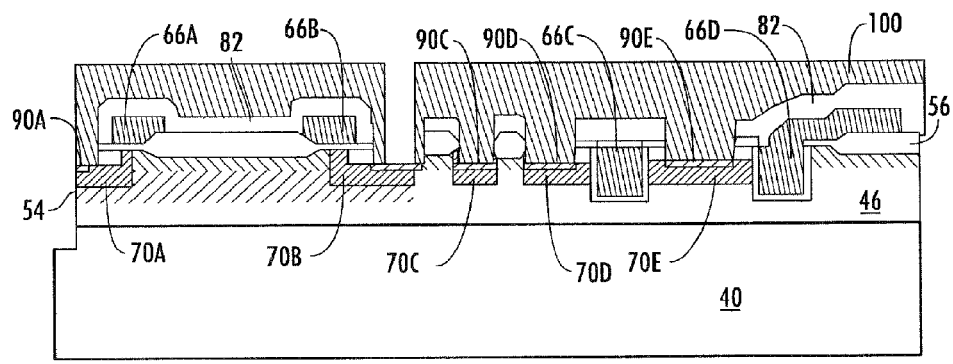
Figure 11:
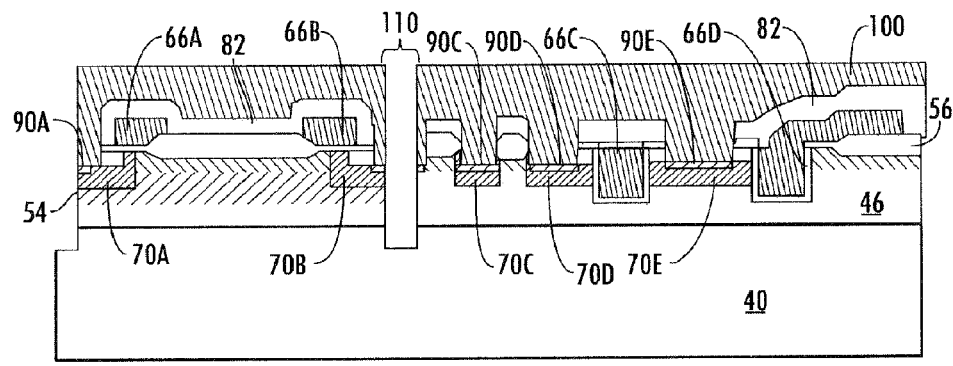
Figure 12:
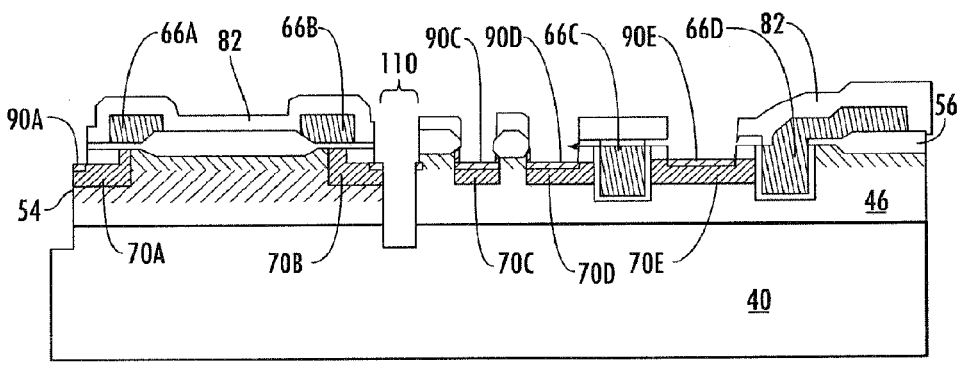

After an optional thin oxide deposition, a trench-substrate-contact (TSC) mask 100 can be formed as depicted in FIG. 10. Mask 100 exposes the substrate in the region of body implant portion 70B, with the remainder of the depicted substrate protected by mask 100. Any exposed oxide is etched, then the epitaxial layer 46 and the semiconductor substrate 40 are etched to result in a structure similar to FIG. 11 having TSC contact opening 110. An optional trench bottom implant can be performed to enhance electrical conductivity with a subsequently formed conductive layer. Resist layer 100 can then be removed and an optional anneal can be performed to result in the structure similar to FIG. 12.

Figure 13:
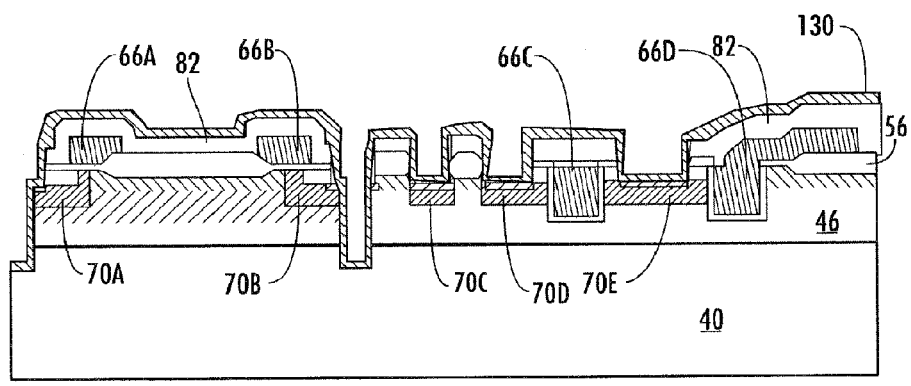

A thin oxide etch to pull back the oxide from the top horizontal surface of the source can be performed, then a thin conformal titanium (Ti) and titanium nitride (TiN) deposition can be performed to result in the conductive metal layer 130 as depicted in FIG. 13. A Ti layer between about 100 Å and about 500 Å, and a TiN layer between about 500 Å to about 1,500 Å would be sufficient.

Figure 14:
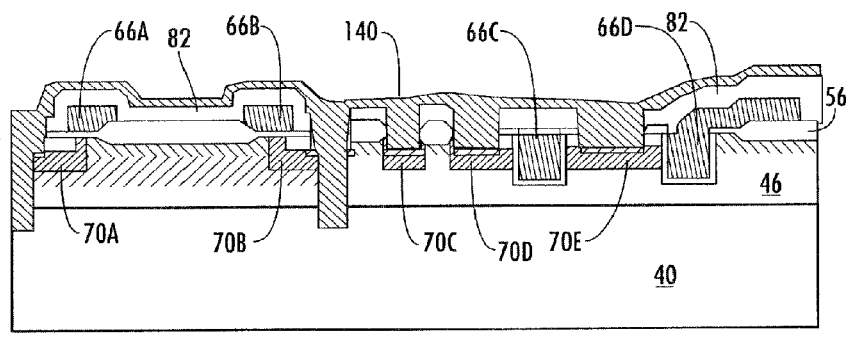

An RTP metal anneal at a temperature of between about 600° C. and about 800° C. for a duration of 20 seconds to 60 seconds in an $N_2$ ambient can be performed to convert the titanium metal layer which contacts the silicon of the epitaxial layer and silicon substrate to titanium silicide ($TiSi_2$) and to densify the TiN to form the TSC metal. An optional tungsten (W) or tungsten silicide ($WSi_x$) deposition can be performed to further reduce the electrical resistance of the TSC structure and to optionally fill the deep trenches to result in the structure of FIG. 14 including metal layer 140. However, it should not be necessary to completely fill the trenches with conductor since the metal is sufficiently conductive and dielectrics will subsequently be deposited on exposed surfaces, which will fill the trenches to result in a sufficiently planar surface.

Figure 15:
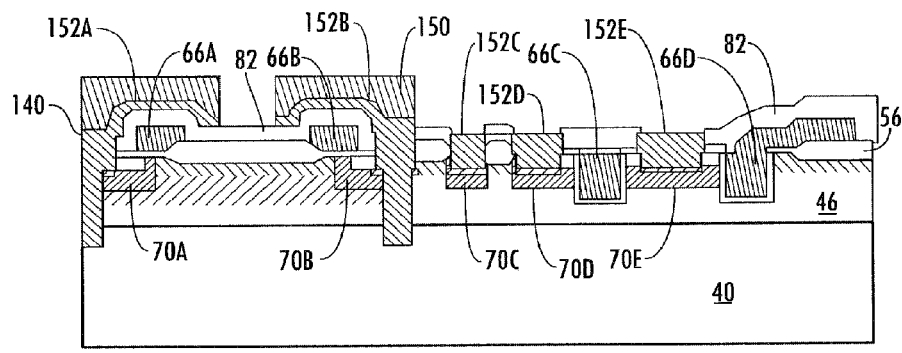

Next, a trench-metal mask 150 can be formed followed by a metal etch to result in the FIG. 15 structure. The metal etch can be performed until underlying dielectric is expose, with an additional over-etch to clear any remaining stringers. This forms individual conductive structures 152A-152E. Structures 152A, 152B will form gate shields to the high-side gate portions 66A, 66B, structure 152C will provide a portion of a floating guard ring, structures 152D and 152E will provide contact portions to the low-side VDMOS source. Thus these functions are performed using different parts of a single conductive structure, which can include one or more conductive layers.

Figure 16:
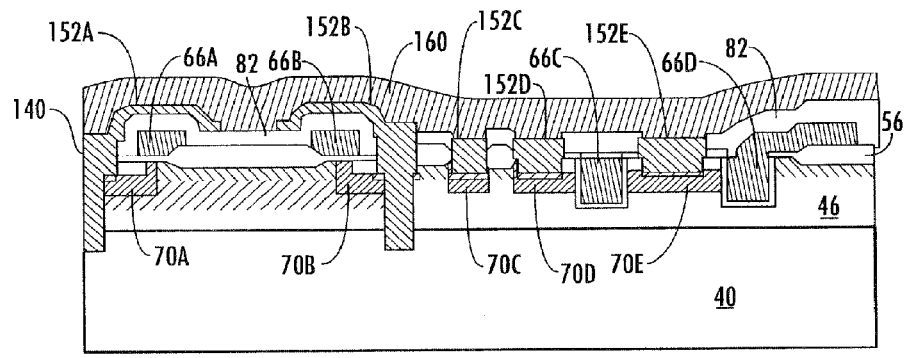

Resist 150 can be stripped, then a low temperature oxide (LTO) can be deposited to a thickness of between about 300 Å and about 1,000 Å followed by a borophosphosilicate glass (BPSG) layer between about 3,000 Å to about 9,000 Å to result in oxide layer 160 as depicted in FIG. 16. The oxide can be flowed and densified at a temperature between about 800° C. to about 900° C.

Figure 17:
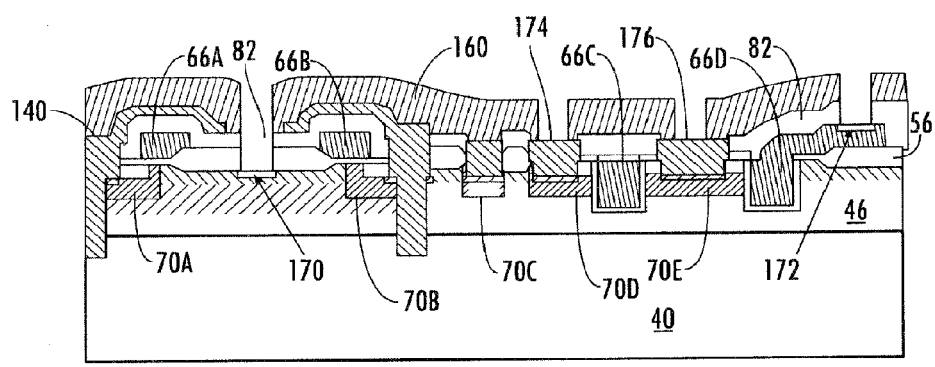

A contact mask can be formed over the oxide 160, then an oxide etch to remove exposed oxide portions can be performed. An N+ implant of arsenic or phosphorous to a dose of between about 1E14 atoms/cm$^2$ to about 6E16 atoms/cm$^2$ at an energy of between about 20 KeV to about 80 KeV with 0° tilt would result in the structure similar to FIG. 17. The implant can be diffused using an RTP process at a temperature of between about 850° C. to about 900° C. for about 60 seconds using an $N_2$ gas flow. The N+ implant forms an N+ drain 170 of the high side LDMOS device and an N+ gate contact to the low-side gate. Also exposed during the etch of oxide layer 160 using the contact mask are low-side transistor source metal 174, 176.

Subsequently, a Ti/TiN deposition of barrier metal 180, an RTP anneal, a deposition of tungsten 182, and a tungsten etch back can be performed to result in tungsten contact plugs 182A-182D. A deposition and patterning of a conductor such as aluminum copper (AlCu) can form metal structures 184A-184C. Structure 184A can form a conductive drain interconnect and be electrically coupled with voltage in ($V_{IN}$) to provide a high-side transistor drain interconnect. Structure 184B can form a conductive source interconnect and be electrically coupled with ground to provide a low-side transistor source interconnect. Structure 184C provides a gate contact to the low-side transistor gate. Thus these functions are performed using different parts of a single conductive structure, which can include one or more conductive layers.

Additionally, body region 70C can provide an integrated floating guard ring to increase trench-DMOS body-drain breakdown voltage. This structure is formed using processing step which also form high-side LDMOS transistor and low-side VDMOS transistor structures.

The method can result in formation of a high-side output power device including an LDMOS transistor device having a planar gate and a low-side VDMOS device having a trench-gate. The same conductive (polysilicon) layer can be used for the gate of each device, and the same body implant can form a body region for each device within the epitaxial layer. Additionally, the substrate provides the switched node (i.e. output node) for the device.

Figure 18:
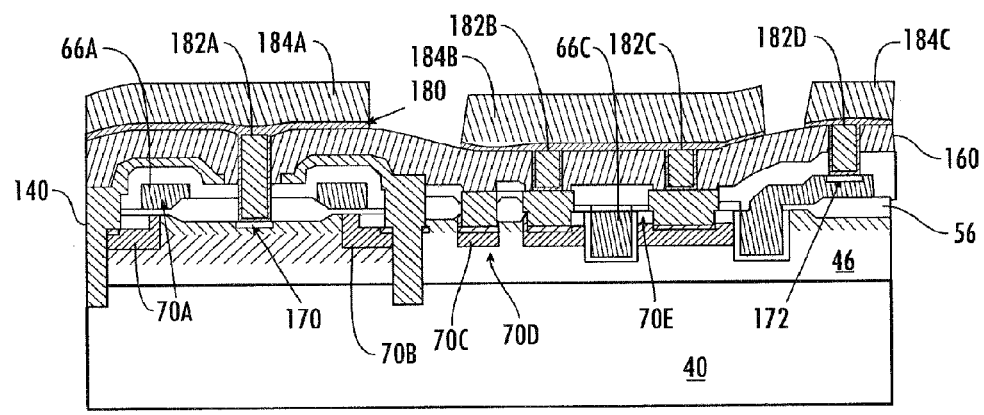

As depicted in FIG. 18, a first portion 152A of metal TSC layer 140 is interposed between gate structure 66A and high-side LDMOS drain metal 184A, and a second portion 152B is interposed between gate structure 66B and drain metal 184A. The structures 152A, 152B, tied to the substrate 50 through the TSC contacts, provide gate shields which can minimize parasitic capacitance and reduce or eliminate parasitic source inductance. The shield function can shield the gate from the electric field surrounding the overlying conductive drain interconnect to reduce gate-to-drain capacitance ($C_{GD}$), and minimize the gate and gate-drain charges ($Q_G$).

Figure 19:
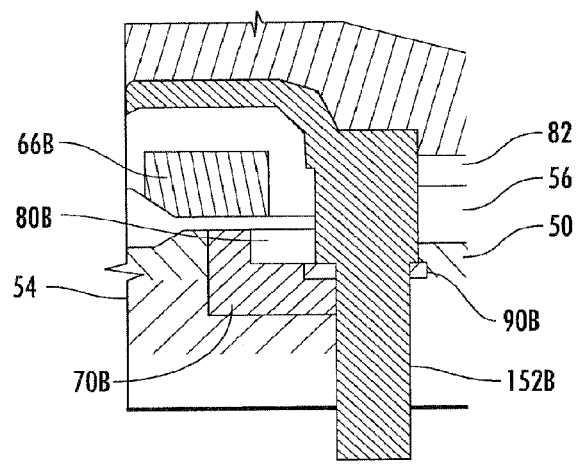

An embodiment of the invention also provides a device having a body contact on all sides of the TSC structure, for example as depicted in FIG. 19. This can result from the formation of the TSC 152B (and analogous structure 152A) inside the body contact region 90B, which exposes the top of the body contact at the entire periphery of the TSC. Therefore, the TSC can be laid out in stripes while maintaining a low resistance body contact.

An embodiment of the device includes nine patterned mask steps, which include an active area mask, a deep body mask, a gate trench mask, a gate polysilicon mask, a body contact mask, a TSC mask, a trench metal mask, a contact mask, and a metal mask. Various cross sections depict an n-channel LDMOS high-side transistor with its drain terminated by the TSC, and with enhanced deep body contact. Also depicted is an n-channel trench-gate DMOS low-side device with a floating P-body guard ring as body edge termination and patterned gate connection.

Figure 20:
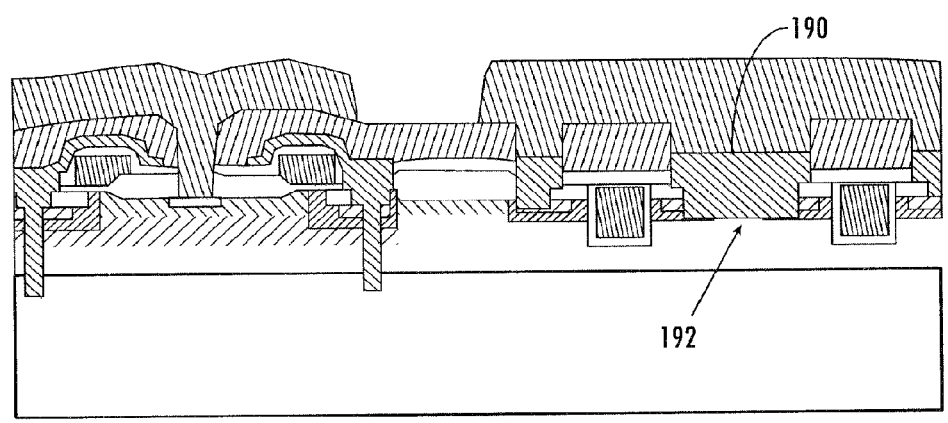
FIG. 20 is a cross section depicting a second embodiment of a voltage converter output structure.

Another embodiment is depicted in FIG. 20. This embodiment includes an integrated Schottky diode which can result in different electrical characteristics from the embodiment depicted in FIG. 18, for example. The Schottky diode is provided by metal structure 190 in contact with n-type epitaxial region 192. The contact to the low-side VDMOS gate (analogous to structures 182D and 184C in FIG. 18) is located at a different cross section of the device. This structure can be implemented without any additional mask steps by using a region of the field oxide to block the body implant. In another embodiment, a body mask can be used to block the body implant from the Schottky contact region, and a source mask to block the source implant from the same Schottky contact region. The source contact for the low-side VDMOS device would require slightly more space than with the previous embodiment. To simplify explanation, additional processing details will not be discussed herein, with a slight modification of the process detailed in FIGS. 2-18 providing a device similar to that depicted in FIG. 20.

Thus an embodiment of the invention has a low implementation cost (low die cost), results in a die which has low parasitic inductance and capacitance, has a minimum die size, and can be optimized based on the circuit requirements. An embodiment can include the use of a high side and low side device on a single die such that the output is available on the back side of the die. A single die can be used for both high-side and low-side power devices fabricated using an efficient process flow with minimal processing steps. The device can be configured to minimize or eliminate any parasitic inductance. The resulting device is compatible with structures which feature high-frequency of operation and minimized parasitic capacitances. At least partly because of a minimum number of components, the assembly cost is minimized. The device is capable of achieving higher power densities than some other devices.

In operation, the heavily doped substrate is the switched node. Thus the back side of the wafer is also the switched node (output) of the output stage, and can therefore be electrically coupled with devices requiring connection to the output stage. Assuming N-channel device are used for both the high-side and low-side power devices, no parasitic inductance between the switched node and the source of the high-side device may be possible, as well as to the drain of the low-side device.

Further, a single layer of metal is required to interconnect each of the drain of the high-side device, the source of the low-side device, and the gates of the two devices.

Additionally, a trench-substrate-contact structure connecting to the semiconductor substrate of the device can function as a high-side device gate shield structure to minimize parasitic capacitance and protect the gate from electrical influences from other device structures, for example from an overlying drain interconnect in addition to eliminating the parasitic source inductance.

In various embodiments, the device structures are formed using a process which combines the TSC structure with a gate shield, which eliminates a number of processing stages.

Forming the high-side output power device and the low-side output power device on a single chip allows for a smaller area than forming the two devices on two separate chips. The device provides highly efficient operation and high-frequency through reduction or elimination of the parasitic inductance. Various embodiments enable the use of an efficient high-side structure (LDMOS) and an efficient low-side structure (trench-gate VDMOS with low $R_{SP}$ on a single chip. The structure further provides an independent threshold voltage control even though the same body diffusion is used.

A chip including the output stage can be co-packaged with a controller IC to yield various benefits. For example, multiple products simply by changing the monolithic power die. Multiple products can leverage a single power-IC design. Because the output devices are formed on a die separate from the controller circuitry, the device provides reduced noise feedback to the controller, and reduced thermal feedback to the controller.

For most effective device operation in any power MOSFETs, low resistance contact connections between the source regions and body regions are needed. Low resistance contacts avoid having the parasitic bipolar transistor (NPN for an N-channel MOSFET) turn on (activate). If the parasitic bipolar turns on, device damage can occur, for example resulting from current run-away, etc. In an embodiment of the invention, the device body and source are integrated into one contact, with the source on a trench sidewall and the body contact at the trench bottom, with the conductive (metal) contact electrically coupled with both. The metal contact (the TSC contact) inside the trench connects all of these diffusion regions together in a very small area with low resistance.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "including." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for forming a semiconductor device, the method comprising:
    forming, on a semiconductor die, a high-side transistor comprising a lateral diffusion metal oxide semiconductor (LDMOS) device;

forming, on the semiconductor die, a low-side transistor comprising a trench-gate vertical diffusion metal oxide semiconductor (VDMOS) device;

forming, on the semiconductor die, a portion of a gate of the high-side transistor and a portion of a gate of the low-side transistor from a single conductive structure; and forming a high-side body region and a low-side body region via an unmasked blanket body implant performed in both a layer of the high-side transistor and a layer of the low-side transistor.

2. The method of claim 1 wherein the single conductive structure is a first single conductive structure and the method further comprises:

etching a layer comprising a conductor to form a contact to the semiconductor wafer section, a shield for the portion of the gate of the high-side transistor, a contact to a floating guard ring to the trench-gate VDMOS transistor, and a contact to a source of the trench-gate VDMOS transistor from a second single conductive structure.

3. The method of claim 2, further comprising etching a layer comprising a conductor to form a drain contact to a drain of the high-side LDMOS transistor, a source contact to a source of the trench-gate low-side VDMOS transistor, a gate contact to the gate of the trench-gate low-side VDMOS device, and a gate contact to the gate of the high-side transistor from a third single conductive structure.

4. The method of claim 1, further comprising forming a conductive trench-source-contact structure which electrically shorts a gate shield for the high-side LDMOS transistor gate to the substrate, which contacts the semiconductor substrate, and which contacts a body contact on all sides of a portion of the trench-source-contact structure.

5. The method of claim 1 wherein the single conductive structure is a first single conductive structure and the method further comprises forming a second single conductive structure which forms:

a contact to a source region of the high-side transistor;
a contact to a body region of the high-side transistor;
a contact to a source region of the low-side transistor;
a contact to a body region of the low-side transistor;
a gate shield for a transistor gate of the high-side transistor;
an electrical connection between the source and body of the high-side device; and
an electrical connection between a drain of the low-side device and a semiconductor substrate of the semiconductor die.

6. The method of claim 1, wherein the semiconductor die is a first semiconductor die and the method further comprises:

providing a second semiconductor die different from the first semiconductor die comprising voltage converter controller circuitry; and
electrically coupling the voltage converter controller circuitry with the first semiconductor die.

7. The method of claim 6, further comprising co-packaging the first semiconductor die and the second semiconductor die into a single semiconductor device.

8. The method of claim 1 wherein the single conductive structure is a first single conductive structure and the method further comprises:

forming a conductive trench contact having at least a portion within a trench in a semiconductor substrate;
forming at least one conductive gate portion of the LDMOS device; and
forming a gate shield interposed between the at least one conductive gate portion of the LDMOS device and a structure which overlies the gate shield, wherein the gate shield and the conductive trench contact are formed from a second single conductive structure.

9. The method of claim 8 further comprising etching a layer comprising a conductor to define:

a conductive drain interconnect electrically coupled to a drain of the LDMOS device; and
a conductive source interconnect electrically coupled to a source of the VDMOS device,
wherein the conductive drain interconnect and the conductive source interconnect are formed from a third single conductive structure.

10. The method of claim 9, further comprising:

electrically coupling a portion of the third single conductive structure which forms the conductive drain interconnect to voltage in (VIN); and
electrically coupling a portion of the third single conductive structure which forms the conductive source interconnect to ground.

11. The method of claim 1 further comprising forming a conductive contact within a trench to electrically couple a high-side transistor source and a high-side transistor body.

12. A method of forming a semiconductor device, the method comprising:

forming a high-side transistor comprising a lateral diffusion metal oxide semiconductor (LDMOS) device on a single semiconductor die;
forming a low-side transistor comprising a trench-gate vertical diffusion metal oxide semiconductor (VDMOS) device on the single semiconductor die; and
forming a portion of a gate of the high-side transistor and a portion of a gate of the low-side transistor from a single conductive structure;
wherein forming the high-side transistor comprises:
forming a body region;
forming a body contact region in the body region; and
forming a trench-substrate-contact (TSC) through the body contact region and the body region such that the TSC contacts a top surface of the body contact region and a side of the body contact region.

13. The method of claim 12 wherein the single conductive structure is a first single conductive structure and the method further comprises:

forming a second single conductive structure which forms a contact to the semiconductor wafer section, a shield for the portion of the gate of the high-side transistor, a contact to a floating guard ring to the trench-gate VDMOS transistor, and a contact to a source of the trench-gate VDMOS transistor.

14. The method of claim 13, further comprising:

forming a third single conductive structure which forms a drain contact to a drain of the high-side LDMOS transistor, a source contact to a source of the trench-gate low-side VDMOS transistor, and a gate contact to the trench-gate low-side VDMOS device gate.

15. The method of claim 12, wherein forming the TSC comprises forming the TSC such that the TSC electrically shorts a gate shield for the high-side transistor to the substrate, the TSC contacting the semiconductor substrate and the body contact region on all sides of a portion of the TSC.

16. The method of claim 12, wherein the single semiconductor die is a first semiconductor die and the method further comprising:

forming a second semiconductor die different from the first semiconductor die comprising voltage converter controller circuitry electrically coupled with the first semiconductor die.

17. The method of claim 16, further comprising co-packaging the first semiconductor die and the second semiconductor die into a single semiconductor device.

18. The method of claim 12 wherein the single conductive structure is a first single conductive structure, and the method further comprises:
forming a conductive trench contact having at least a portion within a trench within a semiconductor substrate;
forming at least one conductive gate portion of the LDMOS device; and
forming a gate shield interposed between the at least one conductive gate portion of the LDMOS device and a structure which overlies the gate shield,
wherein the gate shield and the conductive trench contact are a second single conductive structure.

19. The method of claim 18 further comprising:
forming a conductive drain interconnect electrically coupled to a drain of the LDMOS device; and
forming a conductive source interconnect electrically coupled to a source of the VDMOS device,
wherein the conductive drain interconnect and the conductive source interconnect are a third single conductive structure.

20. The method of claim 19, further comprising:
electrically coupling the conductive drain interconnect to voltage in (VIN); and
electrically coupling the conductive source interconnect to ground.

\* \* \* \* \*